`US008987070B2`

United States Patent
Cheng et al.

(10) Patent No.: US 8,987,070 B2
(45) Date of Patent: Mar. 24, 2015

(54) SOI DEVICE WITH EMBEDDED LINER IN BOX LAYER TO LIMIT STI RECESS

(75) Inventors: Kangguo Cheng, Albany, NY (US); Balasubramanian S. Haran, Albany, NY (US); Shom Ponoth, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 105 days.

(21) Appl. No.: 13/611,182

(22) Filed: Sep. 12, 2012

(65) Prior Publication Data

US 2014/0070357 A1    Mar. 13, 2014

(51) Int. Cl.
| | |
|---|---|
| H01L 21/00 | (2006.01) |
| H01L 21/762 | (2006.01) |
| H01L 21/84 | (2006.01) |
| H01L 27/12 | (2006.01) |
| H01L 29/06 | (2006.01) |
| H01L 29/66 | (2006.01) |
| H01L 29/786 | (2006.01) |

(52) U.S. Cl.
CPC ...... *H01L 27/1203* (2013.01); *H01L 21/76283* (2013.01); *H01L 21/84* (2013.01); *H01L 29/06* (2013.01); *H01L 29/66772* (2013.01); *H01L 29/78654* (2013.01)
USPC ............ 438/151; 257/E29.005; 257/E21.546; 257/499; 438/424

(58) Field of Classification Search
CPC .............................. H01L 21/762; H01L 29/06
USPC .................. 438/151, 424; 257/E29.005, 499, 257/E21.546
See application file for complete search history.

(56) References Cited

U.S. PATENT DOCUMENTS

| | | | |
|---|---|---|---|
| 5,447,884 A | 9/1995 | Fahey et al. | |
| 5,915,192 A * | 6/1999 | Liaw et al. | 438/435 |
| 6,303,413 B1 | 10/2001 | Kalnitsky et al. | |
| 6,509,232 B1 * | 1/2003 | Kim et al. | 438/264 |
| 6,995,447 B2 | 2/2006 | Lee et al. | |
| 8,569,816 B2 * | 10/2013 | Shroff et al. | 257/301 |
| 8,664,050 B2 * | 3/2014 | Cheng et al. | 438/151 |
| 2002/0090797 A1 * | 7/2002 | Chen et al. | 438/437 |
| 2004/0046200 A1 * | 3/2004 | Wu | 257/301 |
| 2004/0242010 A1 * | 12/2004 | Deshpande et al. | 438/710 |
| 2005/0275060 A1 * | 12/2005 | Dokumaci et al. | 257/510 |

(Continued)

OTHER PUBLICATIONS

Gallon, et al, Ultra-Thin Fully Depleted SOI Devices with Thin Box, Ground Plane and Strained Liner Booster, IEEE Inernational SOI Conference, 2006.

(Continued)

*Primary Examiner* — Caleb Henry
(74) *Attorney, Agent, or Firm* — Vazken Alexanian

(57) ABSTRACT

A semiconductor substrate having an isolation region and method of forming the same. The method includes the steps of providing a substrate having a substrate layer, a buried oxide (BOX), a silicon on insulator (SOI) layer, a pad oxide layer, and a pad nitride layer, forming a shallow trench region, etching the pad oxide layer to form ears and etching the BOX layer to form undercuts, depositing a liner on the shallow trench region, depositing a soft mask over the surface of the shallow trench region, filling the shallow trench region, etching the soft mask so that it is recessed to the top of the BOX layer, etching the liner off certain regions, removing the soft mask, and filling and polishing the shallow trench region. The liner prevents shorting of the semiconductor device when the contacts are misaligned.

19 Claims, 7 Drawing Sheets

(56) References Cited

U.S. PATENT DOCUMENTS

| | | | |
|---|---|---|---|
| 2005/0277263 A1* | 12/2005 | Mo et al. | 438/424 |
| 2006/0008993 A1* | 1/2006 | Song et al. | 438/268 |
| 2006/0022270 A1* | 2/2006 | Boyd et al. | 257/351 |
| 2006/0160322 A1* | 7/2006 | Buehrer et al. | 438/424 |
| 2006/0223321 A1* | 10/2006 | Nam et al. | 438/694 |
| 2007/0161207 A1* | 7/2007 | Park | 438/424 |
| 2007/0249129 A1* | 10/2007 | Hall et al. | 438/296 |
| 2008/0224255 A1* | 9/2008 | Kim et al. | 257/506 |
| 2008/0258268 A1* | 10/2008 | Cheng | 257/622 |
| 2009/0173980 A1* | 7/2009 | Cheng et al. | 257/301 |
| 2009/0230508 A1* | 9/2009 | Dyer et al. | 257/532 |
| 2009/0236691 A1* | 9/2009 | Dyer et al. | 257/532 |
| 2010/0038745 A1* | 2/2010 | Wu et al. | 257/510 |
| 2010/0176482 A1* | 7/2010 | Dennard et al. | 257/506 |
| 2010/0213523 A1* | 8/2010 | Cheng et al. | 257/304 |
| 2012/0187524 A1* | 7/2012 | Huang et al. | 257/506 |
| 2012/0196424 A1* | 8/2012 | Krishnan et al. | 438/387 |
| 2012/0292735 A1* | 11/2012 | Tan et al. | 257/506 |
| 2012/0309166 A1* | 12/2012 | Hsuan et al. | 438/435 |
| 2013/0026570 A1* | 1/2013 | Fan et al. | 257/347 |
| 2013/0093040 A1* | 4/2013 | Kim et al. | 257/506 |
| 2013/0230949 A1* | 9/2013 | Booth et al. | 438/157 |
| 2013/0288451 A1* | 10/2013 | Cheng et al. | 438/427 |
| 2013/0320447 A1* | 12/2013 | Yang et al. | 257/347 |
| 2014/0024191 A1* | 1/2014 | Chen et al. | 438/294 |
| 2014/0054698 A1* | 2/2014 | Liu et al. | 257/347 |
| 2014/0054699 A1* | 2/2014 | Liu et al. | 257/347 |
| 2014/0099769 A1* | 4/2014 | Loubet et al. | 438/424 |

OTHER PUBLICATIONS

Lee, et al, A Novel Shallow Trench Isolation Technology Using LPCVD MTO/SiN liner in SOI Wafer, IEEE International SOI Conference, 2001.

Mazure, et al, Advanced Electronic Substrates for the Nanotechnology Era, The Electrochemical Society Interface, Winter 2006.

* cited by examiner

US 8,987,070 B2

SOI DEVICE WITH EMBEDDED LINER IN BOX LAYER TO LIMIT STI RECESS

BACKGROUND OF THE INVENTION

The present invention relates generally to a semiconductor device and method for manufacturing the same. More particularly, a semiconductor device using an extremely thin silicon on insulator (ETSOI) substrate and method for manufacturing the same.

Semiconductor technology is employed in almost every electronic circuit application. One type of semiconductor technology employs Silicon-On-Insulator (SOI) substrates in place of conventional silicon. The benefit of SOI over conventional silicon is the reduced parasitic capacitance that leads to improved performance. The implementation of SOI technology has allowed for the continued scaling planar silicon technology.

Extremely Thin Silicon-On-Insulator (ETSOI) is a leading candidate for further continued scaling of planar silicon technology. However, a concern with fabricating the ETSOI is creating a shallow trench isolation. The shallow trench isolation is a trench that is formed from a top material layer on a wafer to a buried oxide layer and is then filled with an electrically-insulative material such as oxide to separate two devices. During the middle-of-the-line processing (MOL) applications, contacts are put onto the contact points of the semiconductor device.

However, during MOL applications, contacts can be misaligned and touch the top of the shallow trench isolation region, which would create a short circuit and render the device useless. A short circuit occurs when there is an abnormally low-resistance connection betweens two nodes of an electrical circuit that are meant to be at different voltages. Because of the lack of electrical insulation, this creates an undesirable condition such as damage or overheating of the semiconductor. This scenario is illustrated in FIG. 1.

FIG. 1 shows a conventional transistor that has a substrate including a substrate layer (100'), a BOX layer (200'), a silicon on insulator (SOI) layer (300') and a shallow trench isolation (700'). As shown in the figure, the contacts (1000') are either partially or fully in the shallow trench isolation which causes the short circuit, rendering the device completely useless.

The proposed method and apparatus incorporates a liner into the BOX that will limit the recess of the oxide layers during etching and also prevent a short from occurring during MOL applications.

SUMMARY OF THE INVENTION

In consideration of the foregoing, the present invention provides a method and apparatus for creating a semiconductor substrate structure with a liner protecting the shallow trench isolation region in order to prevent damaging the semiconductor through a short. Another purpose of the invention provides a method and apparatus to limit the recess of the oxide layers during etching.

In a first aspect, a method of forming an isolation region in a semiconductor substrate is provided. The method includes the steps of providing a substrate having a substrate layer, a buried oxide (BOX) layer disposed on the substrate layer, a silicon on insulator (SOI) layer disposed on the buried oxide (BOX) layer, a pad oxide layer disposed on the silicon on insulator (SOI) layer, and a pad nitride layer disposed on top of the pad oxide layer, etching through the layers to the substrate layer to form a shallow trench region and an unetched region, etching the pad oxide layer to form ears and etching the BOX layer to form undercuts, depositing a conformal nitride or hafnium oxide liner on the shallow trench region and the unetched region, depositing a soft mask over the surface of the shallow trench region and the unetched region filling the shallow trench region, etching the soft mask so that it is recessed to the top of the BOX layer, etching the liner off of the unetched region, sidewalls of the pad nitride layer, and sidewalls of the SOI layer, removing the soft mask, and filling and polishing the shallow trench region.

In a second aspect, a method of forming an isolation region in a semiconductor substrate is provided. The method includes the steps of providing a substrate having a substrate layer, a buried oxide (BOX) layer disposed on the substrate layer, a silicon on insulator (SOI) layer disposed on the buried oxide (BOX) layer, a pad oxide layer disposed on the silicon on insulator (SOI) layer, and a pad nitride layer disposed on top of the pad oxide layer, etching through the layers into the substrate layer to form a shallow trench region and an unetched region, depositing a conformal nitride or hafnium oxide liner on the shallow trench region and the unetched region, depositing a soft mask over the surface of the shallow trench region and the unetched region filling the shallow trench region, etching the soft mask so that it is recessed to the top of the BOX layer, etching the liner off the sidewalls of the shallow trench region, removing the soft mask, and filling and polishing the shallow trench region.

In a third aspect, a method of forming an isolation region in a semiconductor substrate is provided. The method includes the steps of providing a substrate having a substrate layer, a buried oxide (BOX) layer disposed on the substrate layer, a silicon on insulator (SOI) layer disposed on the buried oxide (BOX) layer, a pad oxide layer disposed on the silicon on insulator (SOI) layer, and a pad nitride layer disposed on top of the pad oxide layer, etching through the layers to the substrate layer form a shallow trench region and an unetched region, etching the pad oxide layer to form ears and etching the BOX layer to form undercuts, depositing a conformal nitride or hafnium oxide liner on the shallow trench region and the unetched region, depositing a soft mask over the surface of the shallow trench region and the unetched region filling the shallow trench region, etching the soft mask so that it is recessed to the top of the BOX layer, etching the liner off of the unetched region and off of sidewalls of the pad nitride layer, removing the soft mask; and filling and polishing the shallow trench region.

In a fourth aspect, a method of forming an isolation region in a semiconductor substrate is provided. The method includes the steps of providing a substrate having a substrate layer, a buried oxide (BOX) layer disposed on the substrate layer, a silicon on insulator (SOI) layer disposed on the buried oxide (BOX) layer, a pad oxide layer disposed on the silicon on insulator (SOI) layer, and a pad nitride layer disposed on top of the pad oxide layer, etching through the layers into the BOX layer to form a shallow trench region and an unetched region, depositing a conformal nitride or hafnium oxide liner on the shallow trench region and the unetched region, depositing a soft mask over the surface of the shallow trench region and the unetched region filling the shallow trench region, etching the soft mask so that it is recessed to the top of the BOX layer, etching the liner off the sidewalls of the shallow trench region, removing the soft mask, and filling and polishing the shallow trench region.

In a fifth aspect, a semiconductor device is provided. A semiconductor device includes a substrate layer, a buried oxide (BOX) layer on the substrate layer, a silicon on insulator (SOI) layer disposed on the buried oxide (BOX) layer, a shallow trench region etched down to the substrate layer forming a bottom in the shallow trench region, wherein the shallow trench region further include undercuts inside the BOX layer and ears in the SOI layer, and a conformal liner, comprised of either a nitride or a hafnium oxide, covering the bottom of the shallow trench region, the ears, and the undercuts.

In a sixth aspect, a semiconductor device is provided. A semiconductor device includes a substrate layer, a buried oxide (BOX) layer on the substrate layer, a silicon on insulator (SOI) layer disposed on the buried oxide (BOX) layer, a shallow trench region etched down to and partially through the substrate layer forming a bottom in the shallow trench region, and a conformal liner, comprised of either a nitride or a hafnium oxide, covering the bottom of the shallow trench region, the ears, and the undercuts.

In a seventh aspect, a semiconductor device is provided. A semiconductor device includes a substrate layer, a buried oxide (BOX) layer on the substrate layer, a silicon on insulator (SOI) layer disposed on the buried oxide (BOX) layer, a shallow trench region etched down to and partially through said BOX layer forming a bottom in the shallow trench region, and a conformal liner, comprised of either a nitride or a hafnium oxide, covering the bottom of the shallow trench region, the ears, and the undercuts.

BRIEF DESCRIPTION OF THE DRAWINGS

For a more complete understanding of the present invention and the advantage thereof, reference is now made to the following description taken in conjunction with the accompanying drawings.

DETAILED DESCRIPTION OF THE PREFERRED EMBODIMENTS

Figure 1:
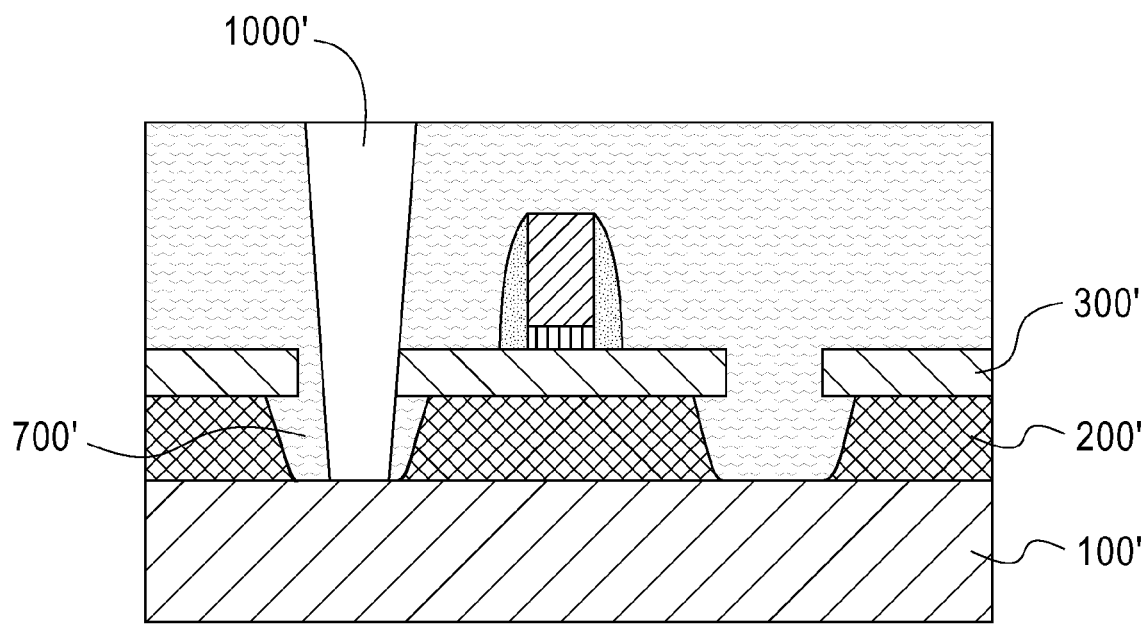
FIG. 1 shows a conventional semiconductor having misaligned contacts over the shallow trench isolation region.

The present invention will now be fully described with reference to the accompanying drawings. This invention may, however, be embodied in many different forms and should not be construed as being limited to the embodiment set forth herein. Rather, this embodiment is provided so that this disclosure will be thorough and complete, and will fully convey the concept of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present.

Figure 2:
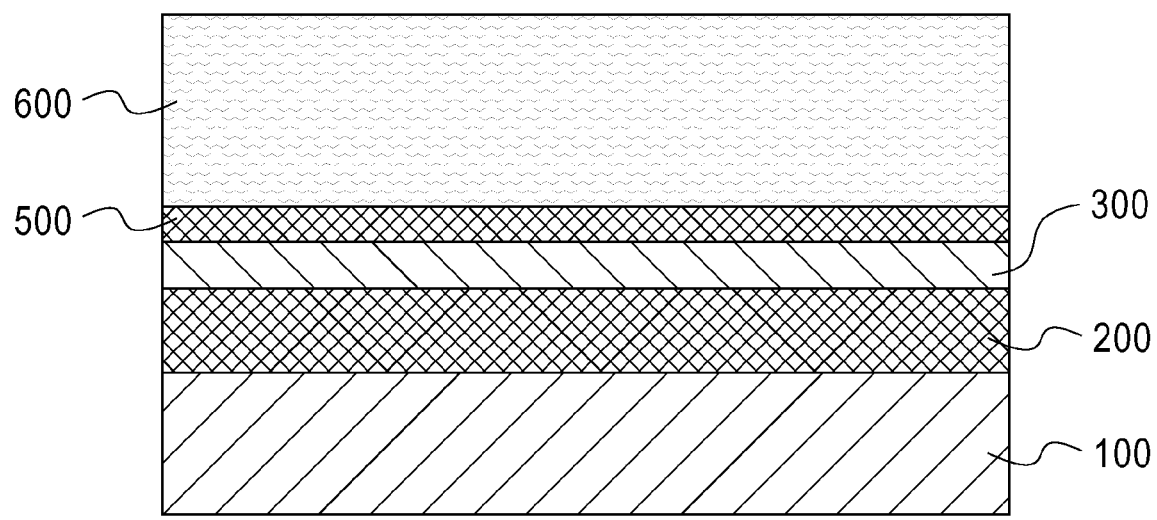
FIG. 2 shows the silicon on insulator device.

The method and apparatus will be described in more detail. The method of the present invention can apply typical front of the line processing as well as replacement metal gate processing. As shown in FIG. 2, the SOI device includes a substrate layer (100), a BOX layer (200) and a ETSOI layer (300). A pad stack, which includes a pad oxide layer (500) and a pad nitride layer (600), is formed atop of the ETSOI layer (300).

The ETSOI layer (300) has a thickness between 2 nm to 10 nm, but preferably 4 nm to 7 nm. The ETSOI layer can be silicon, silicon doped with conventional 'n' or 'p' dopants, silicon germanium (SiGe), silicon germanium carbon (SiGeC), silicon carbon (SiC), III-V semiconductor compounds (for example $In_{1-x}Ga_xAs$, InP, GaAs) or other variations. The thickness of the pad oxide layer (500) has a range of 1 nm to 10 nm, but preferably is about 3 nm to 7 nm. The pad oxide layer is typically a silicon dioxide ($SiO_2$ or $SiO_xH_y$) formed by oxidation. However, the pad oxide could be deposited by a low pressure chemical vapor deposition process (LPCVD), plasma enhanced chemical vapor deposition process (PECVD), atomic layer deposition (ALD), or other methods.

The thickness of the pad nitride layer (600) has a range of 20 nm to 90 nm, but preferably 30 nm to 50 nm. The pad nitride layer is typically a silicon nitride (Si3N4 or $Si_xN_yH_z$), but can be other nitrides such as a silicon oxynitride (SiON or SiONH) or a boron nitride (BN). The pad nitride layer can be deposited by a low pressure chemical vapor deposition process (LPCVD), plasma enhanced chemical vapor deposition process (PECVD), atomic layer deposition (ALD), or other methods. The thickness of the BOX layer (200) has a range of 5 nm to 50 nm, but preferably 10 nm to 50 nm. Typically, the insulating layer of the BOX is an oxide, preferably silicon dioxide.

The SOI substrate is fabricated using techniques that are well known to those skilled in the art. For example, the SOI substrate can be fabricated using a thermal bonding process, or alternatively the SOI substrate may be fabricated by an ion implantation process that is referred to in the art as separation by ion implantation of oxygen (SIMOX). When a thermal bonding process is employed in fabricating the SOI substrate, an optional thinning step may be utilized to thin the top Si-containing layer into an ultra-thin regime. After the layers have been compiled, the shallow trench region (700) is then formed to separate the active areas.

Figure 3:
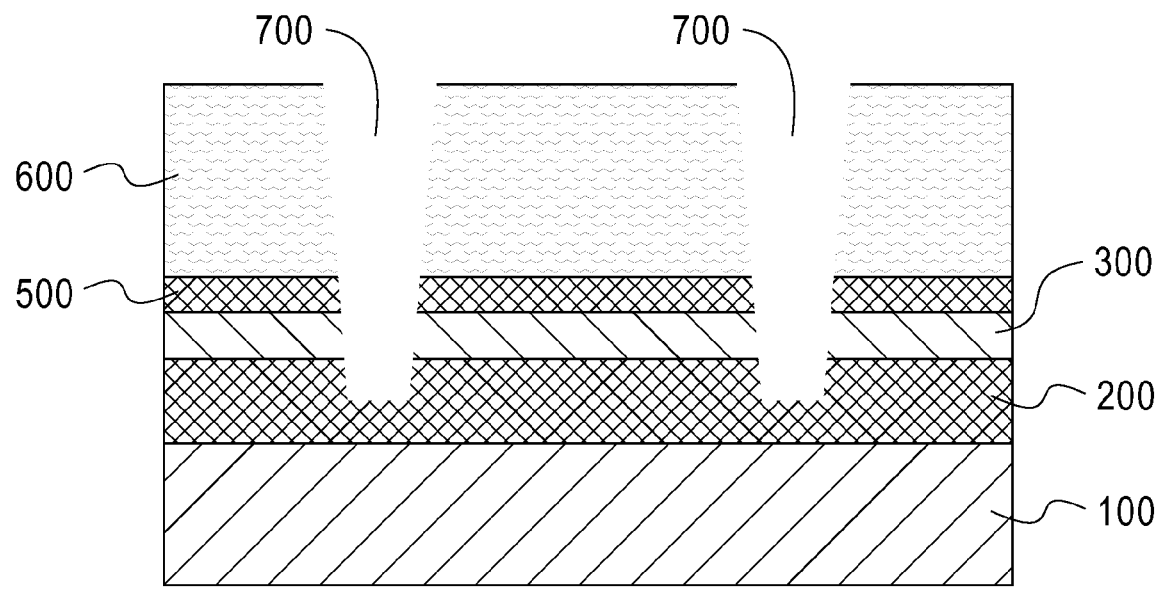
FIG. 3 shows the shallow trench etch.

FIG. 3 shows the shallow trench (700) formation. Lithography is used to etch the shallow trench isolation pattern to the structure. Specifically, the shallow trench (700) is formed by applying a photoresist on the upper surface of the pad stack (400). The photoresist is then exposed to a pattern of radiation and thereafter the pattern in the photoresist is developed using a resist developer. An etching step using Reactive Ion Etching (RIE) with Fluorine transfers the pattern from the photoresist into the pad nitride layer (600). After the initial pattern transfer, the photoresist is removed utilizing a stripping process and then etching continues through the oxide layer (500) and BOX layer (200). The shallow trench etch depth can vary from a range of about halfway into the BOX layer (200) to into the substrate layer (100).

Figure 4:
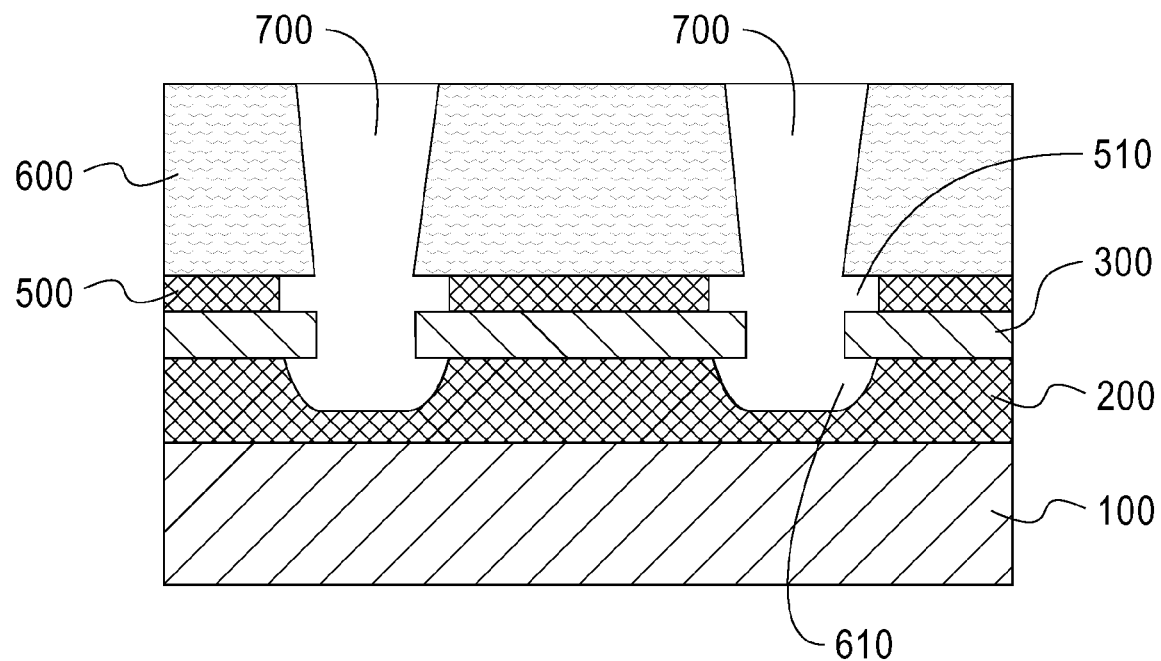
FIG. 4 shows the controlled cut forming the ears and undercuts.

In FIG. 4, the shallow trench region (700) is further etched to form the undercuts and ears. The ears (510) and the undercuts (610) are made by controlled etching using a wet etch, such as dilute hydrogen fluoride (DHF). Similarly, the ear and undercut etches may be created by chemical oxide removal (COR). Other suitable etches are those which selectively etch oxide (pad and/or Box) to the ETSOI layer. The controlled cut etches away a portion the pad oxide layer (500) to form ears (510) and undercuts in the BOX layer (200). The ears (510) are notches in the pad oxide layer (500) that are cut perpendicular to the sidewalls of the shallow trench. The dimensions of the ears have a thickness range from 2 nm to 15 nm, but preferably are between 5 nm to 10 nm.

As shown in FIG. 4, the undercuts (610) are notches in the BOX layer that are cut perpendicular to the sidewall of the shallow trench region (700). The undercuts are etched directly below the ETSOI layer (300). The dimensions of the undercuts range from about 2 nm to 15 nm, but preferably are between 5 nm to 10 nm. The resulting structure is having portions of the ETSOI layer (300) jutting out in the shallow trench region (700).

Figure 5:
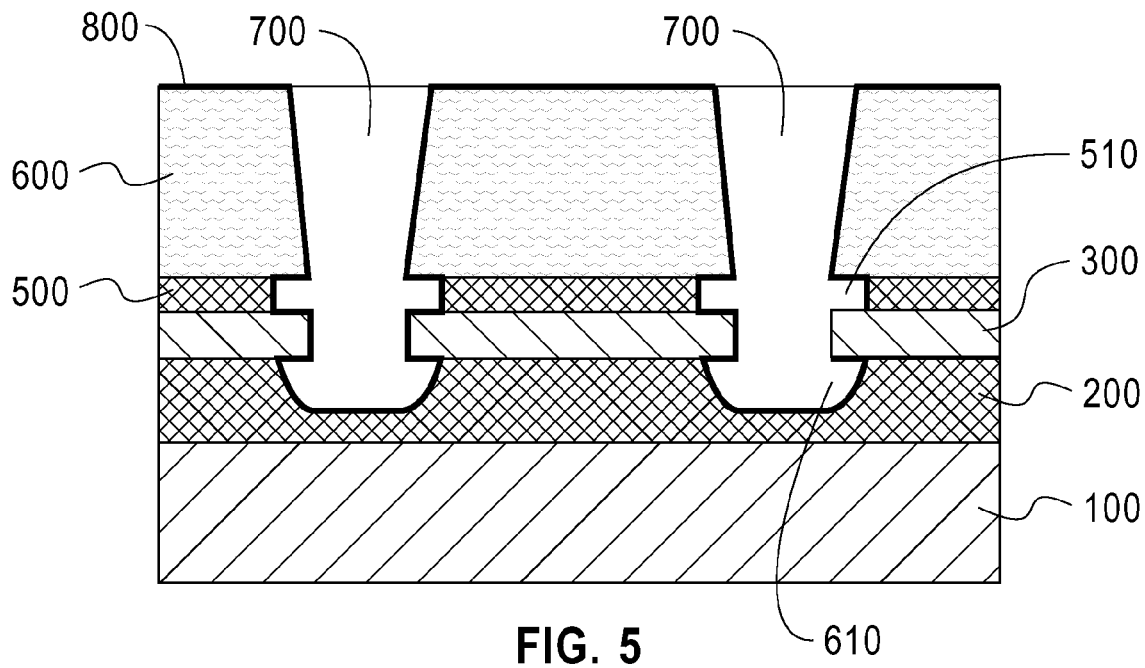
FIG. 5 shows the liner deposited in the shallow trench.

According to FIG. 5, a liner (800) is then deposited along the shallow trench region (700). This is done by a conformal liner deposition of nitride, aluminum oxide, oxide, hafnium oxide, or hafnium silicate on the top surface of the device. The key characteristics of the conformal liner deposition material are that it is to be resistant to most of the wet processing encounter in a typical build, while being able to be easily etched for the contact etch step. Suitable nitride materials include the same materials mentioned earlier with respect to the pad nitride. In a preferred embodiment, a nitride liner is silicon nitride ($Si_3N_4$). The liner (800) is formed by chemical vapor deposition (CVD), preferably, low pressure chemical vapor deposition (LP-CVD), or by atomic layer deposition (ALD). The liner (800) is preferably formed at a temperature from the range of 650°-750° C.

The liner (800) as a thickness range of 2 nm to 8 nm. The conformal deposit covers the bottom of the bottom region and sidewall region of the shallow trench isolation (700), including the ears (510) and undercuts (610). This liner (800) serves two purposes. The first and primary function is to withstand DHF etching, which will limit the recess of the shallow trench isolation region and ensure there is a minimum amount of oxide between the SOI and substrate when it reaches the middle of the line (MOL) processing. The second purpose is to serve as an insulator between the SOI or substrate region and the contacts to protect the device from shorting out. Once the primary objective is met, for an MOL scheme employing nitride on top of the RSD, the liner will be able to stop in the remaining oxide to prevent short circuits of the gate contacts.

Figure 6:
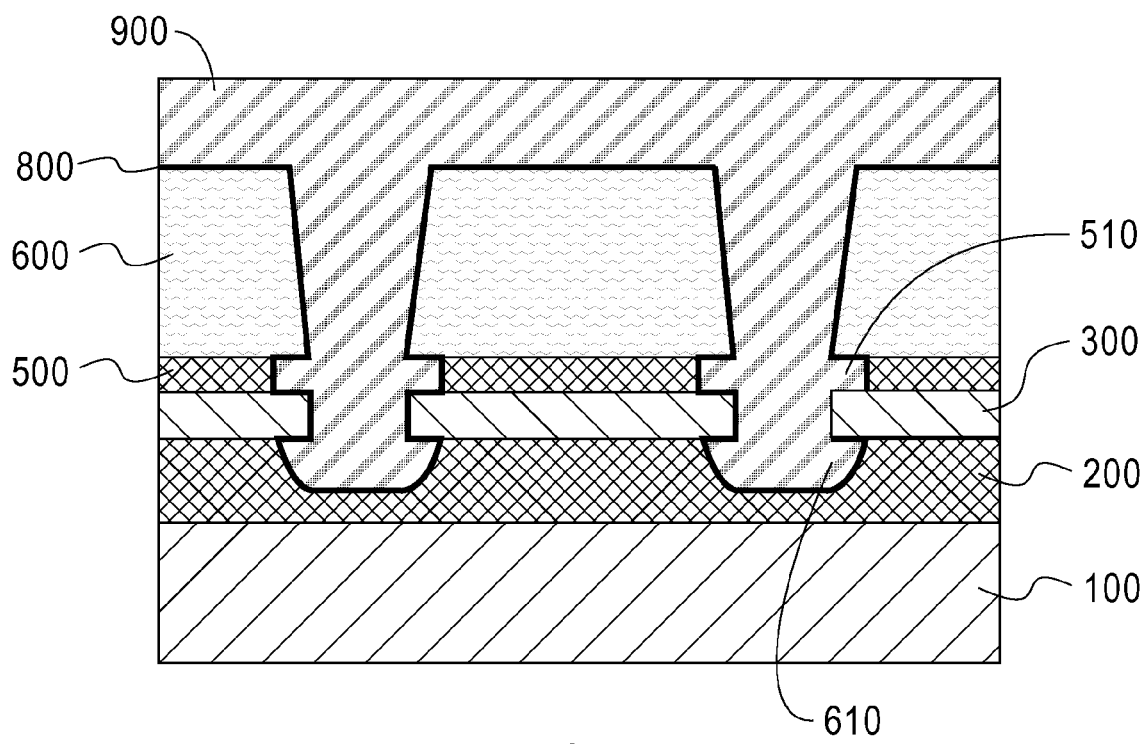
FIG. 6 shows the masking of the shallow trench.
Figure 7:
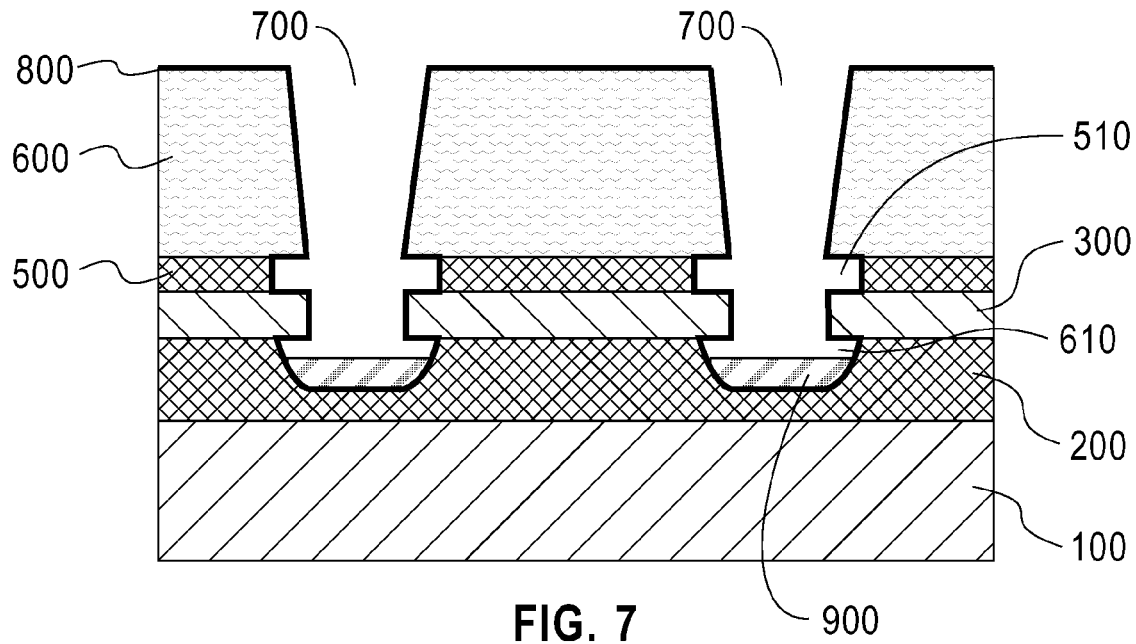
FIG. 7 shows the etching of the mask.

In FIG. 6, the shallow trench region (700) is then filled with an organic soft mask (900). The soft mask material can be an organic planarizing layer, or a spin on oxide that can be polished to stop on the pad nitride. According to FIG. 7, the soft mask (900) is then time etched within the shallow trench isolation (700) creating a recessed mask on the bottom of the shallow trench isolation. A time etch is commonly known in the art to mean a controlled etch for a predetermined removal time. In the case of an organic mask, an oxygen RIE is used. However, the soft mask (900) can be recessed from as high as the top of the pad oxide layer (500) to as low as the bottom of the shallow trench isolation region (700), depending on the design of the liner.

Figure 8:
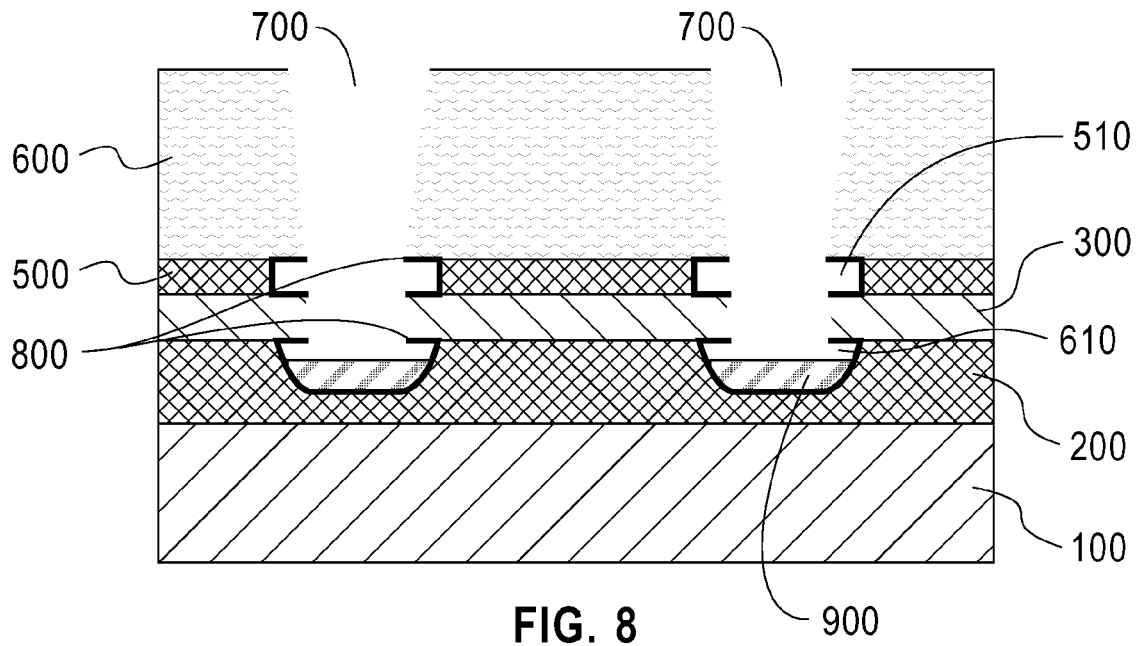
FIG. 8 shows the liner being etched from the shallow trench.
Figure 9:
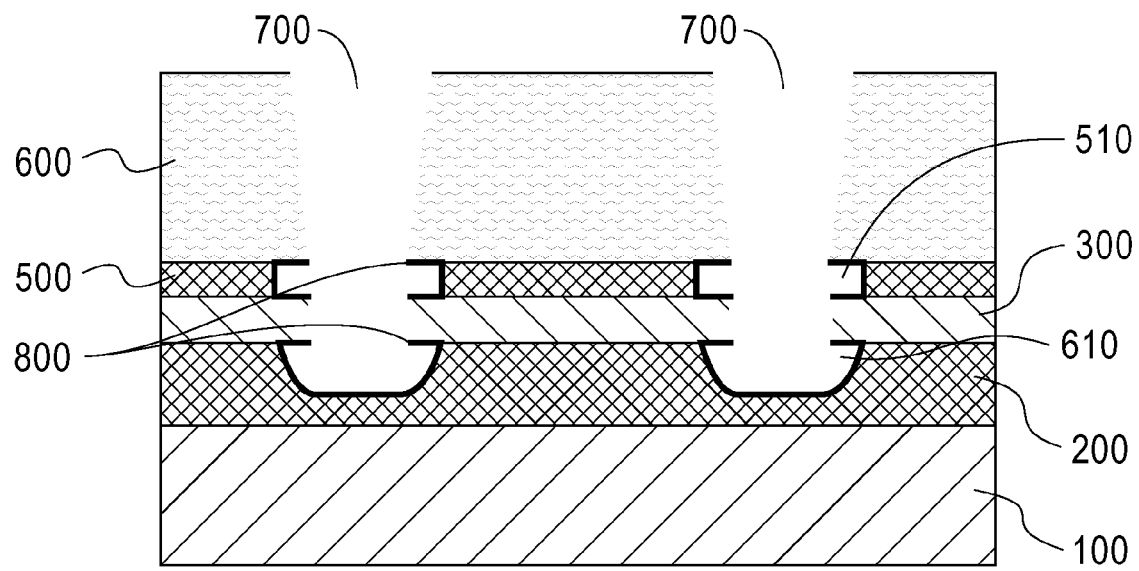
FIG. 9 shows the masking layer being removed.
Figure 13:
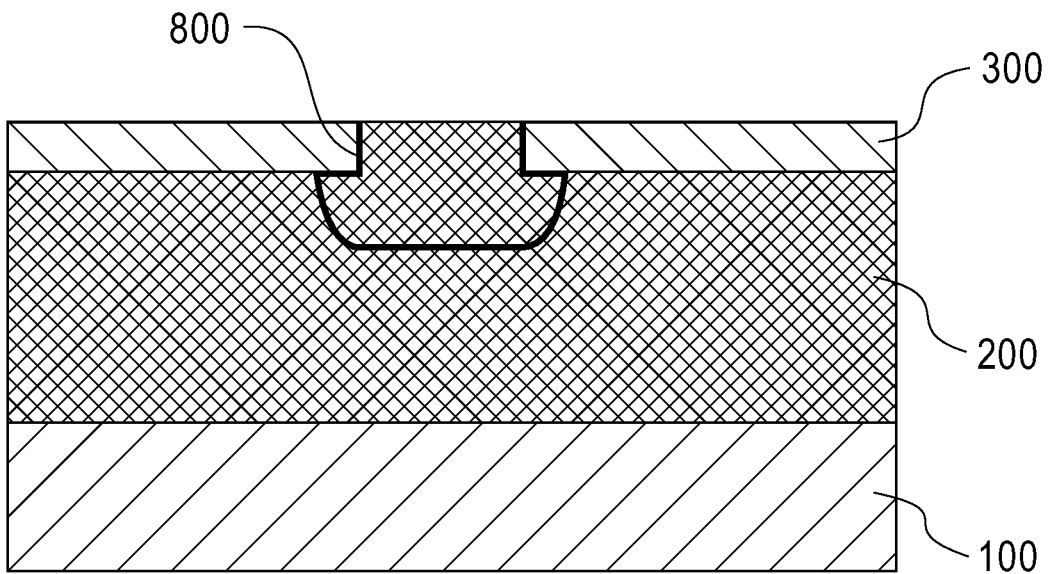
FIG. 13 shows the shallow trench with the liner touching the silicon on insulator sidewall.

In FIG. 8, the liner (800) is then etched away from the surface of the structure using plasma etch. Depending on what is used for the liner, the etching process differs. For example, for hafnium oxide, a chlorine based RIE will be used. For a nitride liner, a hot phosphoric acid wet etch will be used. Because of the soft mask (900), the liner is etched away on the sidewalls of the shallow trench isolation, leaving the liner on the bottom of the shallow trench isolation (700). However, the liner (800) is still present in the ears of padded oxide layer and the undercut of the BOX layer (200). The liner can also be present on the sidewalls of the ETSOI layer as shown in FIG. 13. The mask layer is then removed from the BOX layer (200) using oxygen or hydrogen ash as shown in FIG. 9, thus leaving a liner deposited on the bottom of the shallow trench region (700).

Figure 10:
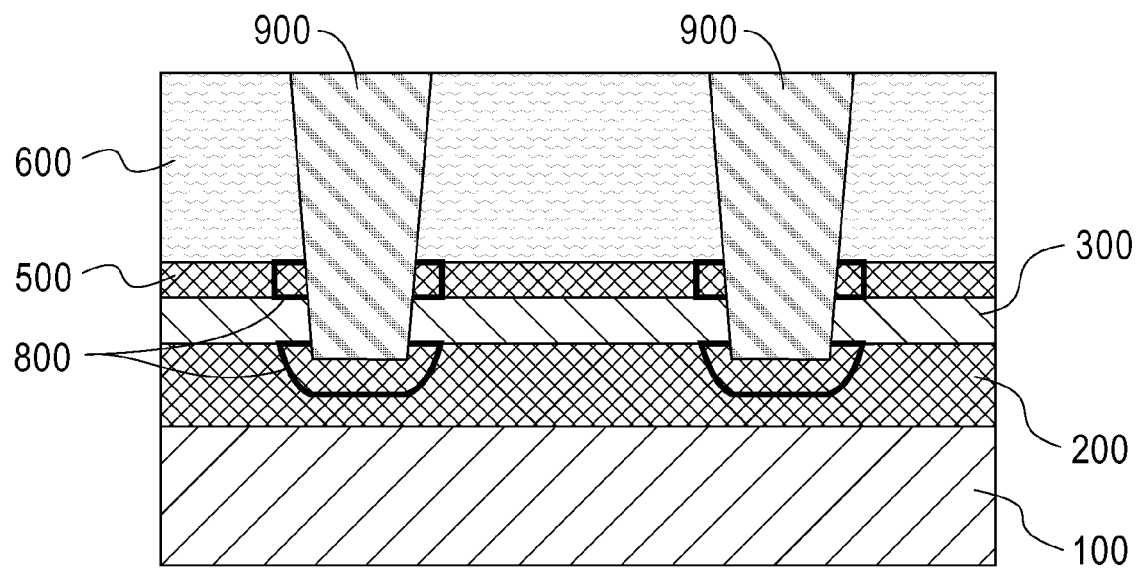
FIG. 10 shows the shallow trench isolation fill and polish

According to FIG. 10, the shallow trench (700) is then filled with an insulator, preferably a silicon oxide though other insulators including and not limited to carbon-doped oxides or oxynitrides could be used. The shallow trench isolation fill may be formed by any method known to a person of ordinary skill in the art including, inter alia, a tetra ethyl ortho silicate (TEOS) based chemical vapor deposition (CVD) process. The CVD process may be low pressure, high density, plasma enhanced or other methods. The precursor, as mentioned is preferably TEOS but a silane ($SiH_4$) based chemistry is also within the scope of the present invention.

A planar surface is created on the shallow trench isolation fill by a chemically/mechanical polishing (CMP). The polishing brings down the silicon dioxide so that it is flush with the pad nitride layer using a selective polish process such as fixed abrasive (FA) CMP. This is usually to a depth of around 10 nm or until the pad nitride is polished away. The CMP step is followed by pad nitride removal using hot phosphoric acid. If the liner (800) is made from nitride, the hot phosphoric acid will remove the ears in the pad oxide layer. If the liner is made from hafnium oxide, the ears can be removed during a gate formation ("PC") etch. The remaining liner runs along the bottom of the shallow trench isolation in the BOX layer and on the sides of the shallow trench isolation in the ETSOI layer.

After the shallow trench isolation fill and polish is completed, the standard process flow of forming a semiconductor is then implemented that may include the following:

1. Removing the pad stack;
2. A conventional gate oxidation pre-clean and gate dielectric formation;
3. Gate electrode formation and patterning;
4. Sidewall spacer formation by deposition and etching;
5. Source/drain extension formation;
7. Raised Source/drain formation;
8. Final spacer formation;
9. Silicide formation
10. Middle-of-the-line (MOL) Inter-level dielectric (ILD) deposition;
11. Contact etch and metallization; and
12. Back-end-of-the-line (BEOL) process.

Figure 11:
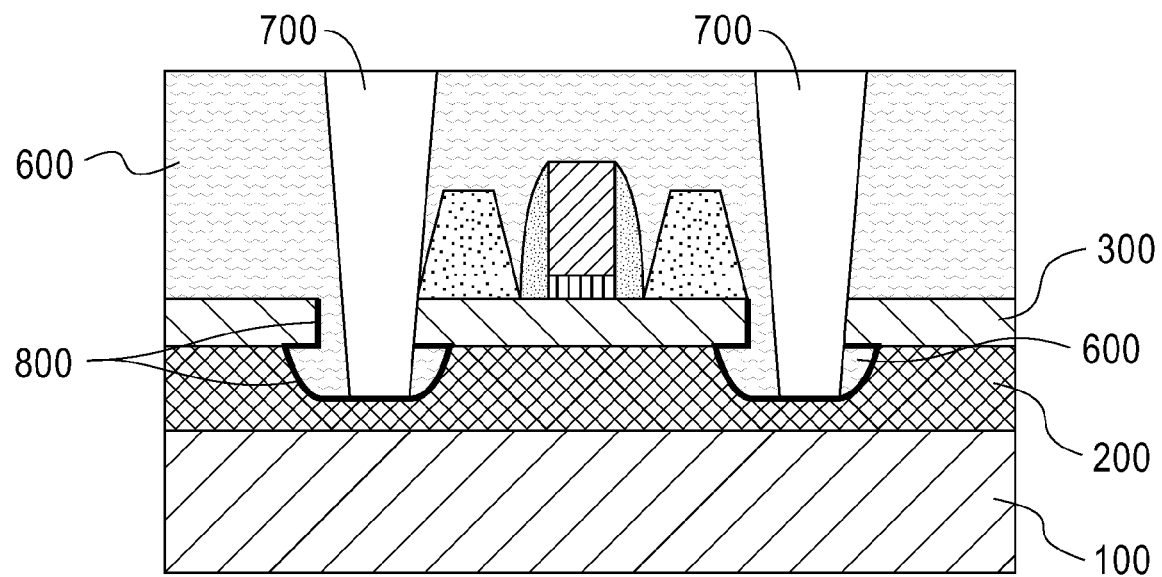
FIG. 11 shows the final semiconductor product.

The processing steps 1-12 mentioned above are well known to those skilled in the art thereof a detailed description of the same is not needed herein. It should be noted that the standard process flow used to fabricate the structure is not critical to the invention. FIG. 11 shows the final semiconductor structure including the liner in the shallow trench isolation (700). Note that the liner (800) is on the sidewalls of the shallow trench isolation (700). The undercut of the BOX and liner can differ as will be explained in the following paragraphs.

Figure 12:
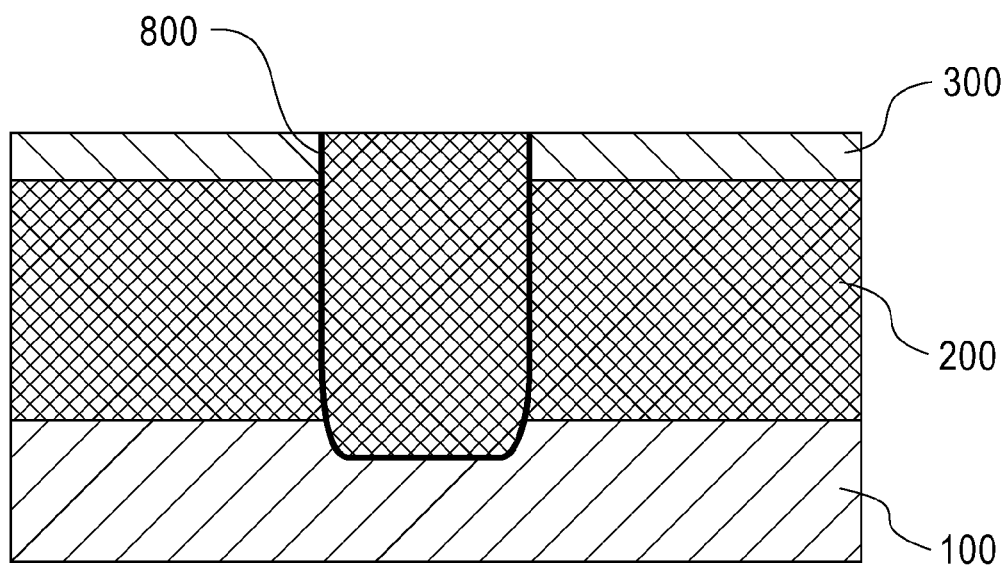
FIG. 12 shows the shallow trench etched into the substrate layer.

In FIG. 12, another embodiment shows the structure can be formed without the ears and without the undercut in the pad oxide layer. Instead of etching from a depth of about halfway into the BOX layer (200), the shallow trench isolation (700) is etched deep into the substrate layer (100). From here, the structure follows the same steps as described previously. The deep etch is independent of the formation of ears. The way to avoid ear formation is to ensure the SOI is also etched. This could be achieved either with a non-selective etch in which the SOI and oxide are both etched or by the use of a separate etch to etch the SOI that is sticking out.

A conformal liner deposition of either nitride or hafnium oxide is deposited in the shallow trench isolation (700) region. This creates a liner (800) which acts as an insulator and can withstand wet etching and as an insulator to protect the device from being damaged by a short during middle-of-the-line applications. The liner (800) has a thickness of 2 nm to 8 nm.

The shallow trench isolation (700) is then filled with an organic soft mask material such as an organic planarazing layer or a spin on oxide that can be polished to stop on the pad nitride. The soft mask is then time etched back. The soft mask (900) can be recessed from as high as the top of the pad oxide layer (500) to as low as the bottom of the shallow trench isolation region (700), depending on the design of the liner. The shallow trench isolation (700) is then filled and polished. After the shallow trench isolation fill and polish is completed, the standard process flow of forming a semiconductor is then implemented. The resulting structure is a deep shallow trench isolation (700) into the substrate layer with a liner (800) to protect the device from misaligned contacts during middle-of-the-line applications. It also prevents the recess of the oxide layer during wet etching.

In FIG. 13, another embodiment includes a shallow trench isolation (700), but with the liner on the sidewalls. The process as the same as mentioned above, however, the soft mask (900) is recessed to the top of the pad oxide layer. The depth of the shallow trench isolation ranges from a depth of 5 nm below the SOI to bottom of the entire BOX thickness.

A conformal liner deposition of either nitride or hafnium oxide is deposited in the shallow trench isolation. This creates a liner (800) which acts as an insulator to protect the device from misaligned contacts during middle-of-the-line applications and can withstand wet etching. The liner (800) has a thickness of 2 nm to 8 nm, but preferably is between 3 nm to 7 nm. This embodiment shows the liner (800) being present on the sidewall of the SOI layer (300).

Figure 14:
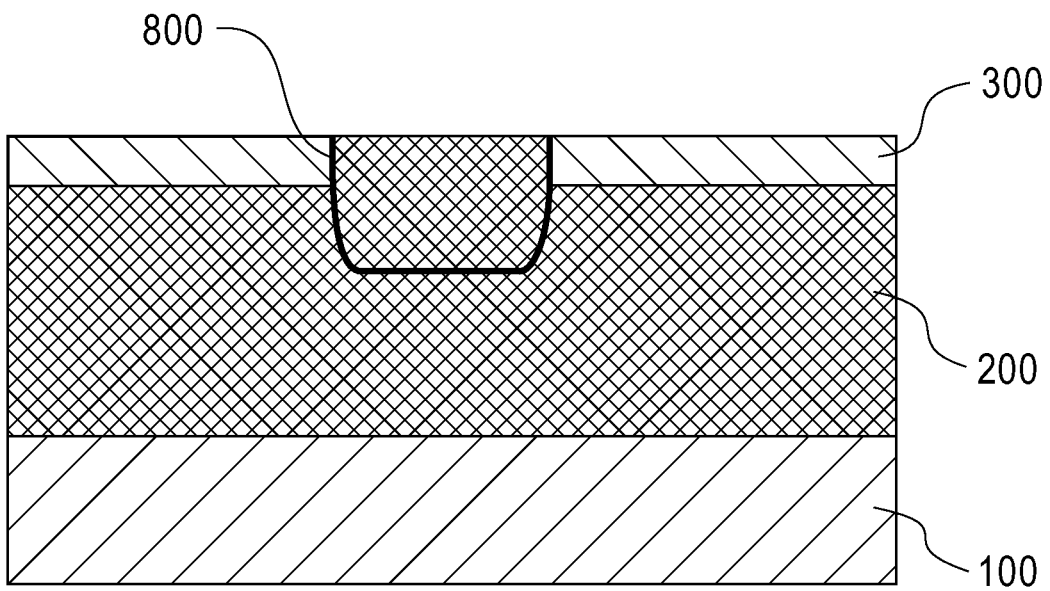
FIG. 14 shows another embodiment of the shallow trench isolation without undercuts or ears.

In FIG. 14, another embodiment includes a shallow trench isolation (700) etched to go down into BOX layer (200) without the undercuts and ears. The process as the same as mentioned above, however, when etching the shallow trench isolation (700), there will be no etching for the ears and undercuts. Instead, there will be an isotropic etch of both the ETSOI layer (300) and the BOX layer (200). The depth of the shallow trench isolation ranges from a depth of 5 nm below the SOI to bottom of the entire BOX thickness.

A conformal liner deposition of either nitride or hafnium oxide is deposited in the shallow trench isolation (700). The liner (800) has a thickness of 2 nm to 8 nm, but preferably between 3 nm to 7 nm. This creates a liner (800) which acts as an insulator to protect the device from misaligned contacts during middle-of-the-line applications and can withstand wet etching.

The shallow trench isolation (700) is then filled with an organic soft mask material such as an organic planarazing layer or a spin on oxide that can be polished to stop on the pad nitride. The soft mask is then time etched back to the top of the SOI layer. The soft mask (900) can be recessed from as high as the top of the pad oxide layer (500) to as low as the bottom of the shallow trench isolation region (700), depending on the design of the liner. The shallow trench isolation (700) is then filled and polished. The shallow trench isolation (700) is then filled and polished. After the shallow trench isolation fill and polish is completed, the standard process flow of forming a semiconductor is then implemented.

The resulting structure is a shallow trench isolation (700) in the BOX layer (200) that has a liner (800) with no ears or undercuts to protect the device from misaligned contacts during middle of the line processing. The liner (800) has a thickness of 2 nm to 8 nm, but preferably is between 3 nm to 7 nm. The liner (800) also prevents the recess of the shallow trench isolation oxide layer.

Although the embodiments of the present invention have been described hereinabove, the present invention is not limited to the foregoing embodiments. The specific embodiments discussed are merely illustrative of specific ways to make and use the invention, and do not limit the scope of the invention.

We claim:

1. A method of forming an isolation region in a semiconductor substrate, the method comprising the steps of:
   providing a substrate having a substrate layer, a buried oxide (BOX) layer disposed on said substrate layer, a silicon on insulator (SOI) layer disposed on said buried oxide (BOX) layer, a pad oxide layer disposed on said silicon on insulator (SOI) layer, and a pad nitride layer disposed on top of said pad oxide layer;
   etching through the layers to said substrate layer to form a shallow trench region and an unetched region;
   etching the pad oxide layer to form ears and etching the BOX layer to form undercuts;
   depositing a conformal nitride or hafnium oxide liner on said shallow trench region and said unetched region;
   depositing a soft mask over the surface of said shallow trench region and said unetched region filling the shallow trench region;
   etching the soft mask so that it is recessed to the top of the BOX layer;
   etching the liner off of said unetched region, sidewalls of said pad nitride layer, and sidewalls of said SOI layer;
   removing the soft mask; and
   filling and polishing the shallow trench region.

2. The method according to claim 1, wherein the step of etching to form the undercuts and ears use dilute hydrogen fluoride (DHF) or chemical oxide removal (COR).

3. The method according to claim 1, wherein the filling and polishing step further comprises removing the ears.

4. The method according to claim 1, wherein the step of etching the liner off comprises using a chlorine based RIE or a hot phosphoric acid wet etch.

5. The method according to claim 1, wherein the step of depositing the soft mask material includes using a soft mask material that is an organic planarizing layer, or a spin on oxide.

6. The method according to claim 1, wherein during the step of etching to form the shallow trench, a depth of said shallow region extends to a range up to the middle of said BOX layer.

7. A method of forming an isolation region in a semiconductor substrate, the method comprising the steps of:
   providing a substrate having a substrate layer, a buried oxide (BOX) layer disposed on said substrate layer, a silicon on insulator (SOI) layer disposed on said buried oxide (BOX) layer, a pad oxide layer disposed on said silicon on insulator (SOI) layer, and a pad nitride layer disposed on top of said pad oxide layer;
   etching through all the layers into said substrate layer to form a deep shallow trench region and an unetched region, wherein a depth of said deep shallow trench extends deep into said substrate layer replacing a portion thereof;
   depositing a conformal nitride or hafnium oxide liner directly on said deep shallow trench region and said unetched region;

depositing a soft mask over the surface of said deep shallow trench region and said unetched region filling the deep shallow trench region;

etching the soft mask so that it is recessed to the top of the BOX layer;

etching the liner off the sidewalls of said deep shallow trench region;

removing the soft mask; and filling and polishing said deep shallow trench region.

8. The method according to claim 7, wherein the step of etching the liner off comprises using a chlorine based RIE or a hot phosphoric acid wet etch.

9. The method according to claim 7, wherein the step of depositing the soft mask material includes using a soft mask material that is an organic planarizing layer, or a spin on oxide.

10. The method according to claim 7, wherein the liner has a thickness of 2-8 nm.

11. A method of forming an isolation region in a semiconductor substrate, the method comprising the steps of:

providing a substrate having a substrate layer, a buried oxide (BOX) layer disposed on said substrate layer, a silicon on insulator (SOI) layer disposed on said buried oxide (BOX) layer, a pad oxide layer disposed on said silicon on insulator (SOI) layer, and a pad nitride layer disposed on top of said pad oxide layer;

etching through the layers to said substrate layer form a shallow trench region and an unetched region;

etching the pad oxide layer to form ears and etching the BOX layer to form undercuts;

depositing a conformal nitride or hafnium oxide liner on said shallow trench region and said unetched region;

depositing a soft mask over the surface of said shallow trench region and said unetched region filling the shallow trench region;

etching the soft mask so that it is recessed to the top of the BOX layer;

etching the liner off of said unetched region and off of sidewalls of said pad nitride layer;

removing the soft mask; and filling and polishing the shallow trench region.

12. The method according to claim 11, wherein the step of etching to form the undercuts and ears use dilute hydrogen fluoride (DHF) or chemical oxide removal (COR).

13. The method according to claim 11, wherein the filling and polishing step further comprises removing the ears.

14. The method according to claim 11, wherein the step of etching the liner off comprises using a chlorine based RIE or a hot phosphoric acid wet etch.

15. The method according to claim 11, wherein the step of depositing the soft mask material includes using a soft mask material that is an organic planarizing layer, or a spin on oxide.

16. A method of forming an isolation region in a semiconductor substrate, the method comprising the steps of:

providing a substrate having a substrate layer, a buried oxide (BOX) layer disposed on said substrate layer, a silicon on insulator (SOI) layer disposed on said buried oxide (BOX) layer, a pad oxide layer disposed on said silicon on insulator (SOI) layer, and a pad nitride layer disposed on top of said pad oxide layer;

etching through the layers into said BOX layer to form a shallow trench region and an unetched region, wherein a depth of said shallow trench region ranges between 5 nm below said SOI layer to the bottom of said BOX layer;

depositing a conformal nitride or hafnium oxide liner on said shallow trench region and said unetched region;

depositing a soft mask over the surface of said shallow trench region and said unetched region filling the shallow trench region;

etching the soft mask so that it is recessed to the top of the BOX layer;

etching the liner off the sidewalls of said shallow trench region;

removing the soft mask; and filling and polishing the shallow trench region.

17. The method according to claim 16, wherein the step of etching the liner off comprises using a chlorine based RIE or a hot phosphoric acid wet etch.

18. The method according to claim 16, wherein the step of depositing the soft mask material includes using a soft mask material that is an organic planarizing layer or a spin on oxide.

19. The method according to claim 16, wherein the liner has a thickness of 2-8 nm.

* * * * *